United States Patent
Honda et al.

(10) Patent No.: US 8,481,248 B2
(45) Date of Patent: Jul. 9, 2013

(54) METHOD FOR FABRICATING MICROMACHINE COMPONENT OF RESIN

(75) Inventors: Nao Honda, Kita-ku (JP); Satoshi Mori, Kita-ku (JP); Shuji Tanaka, Sendai (JP); Masayoshi Esashi, Sendai (JP)

(73) Assignees: Tohoku University, Miyagi (JP); Nippon Kayaku Kabushiki Kaisha, Tokyo (JP)

( * ) Notice: Subject to any disclaimer, the term of this patent is extended or adjusted under 35 U.S.C. 154(b) by 735 days.

(21) Appl. No.: 11/922,529

(22) PCT Filed: Jun. 15, 2006

(86) PCT No.: PCT/JP2006/311995
§ 371 (c)(1),
(2), (4) Date: Mar. 3, 2008

(87) PCT Pub. No.: WO2006/137318
PCT Pub. Date: Dec. 28, 2006

(65) Prior Publication Data
US 2009/0035706 A1       Feb. 5, 2009

(30) Foreign Application Priority Data

Jun. 23, 2005    (JP) ................................ 2005-183353

(51) Int. Cl.
*G03F 7/22*       (2006.01)
(52) U.S. Cl.
USPC ............................ 430/320; 430/325; 430/394
(58) Field of Classification Search
USPC .......................................... 430/320, 325, 394
See application file for complete search history.

(56) References Cited

U.S. PATENT DOCUMENTS

| | | | | |
|---|---|---|---|---|
| 5,378,583 A | 1/1995 | Guckel et al. | .................. | 430/325 |
| 2004/0245669 A1 | 12/2004 | Nishi et al. | .................... | 264/219 |
| 2005/0146022 A1 * | 7/2005 | Franosch et al. | .............. | 257/704 |

FOREIGN PATENT DOCUMENTS

| | | |
|---|---|---|
| JP | 7-92687 | 4/1995 |
| JP | 2001-329993 | 11/2001 |
| JP | 2003-170399 A | 6/2003 |
| JP | 2004-291234 | 10/2004 |
| JP | 2004-347031 A | 12/2004 |
| JP | 2005-155387 | 6/2005 |
| JP | 2005-171962 | 6/2005 |

OTHER PUBLICATIONS

International Search Report dated Jul. 31, 2006.
Japanese Communication, with English translation, dated Apr. 26, 2011 in corresponding foreign patent application No. JO 2005-183353.
Korean Communication, with English translation, dated Sep. 14, 2012 in corresponding Korean Patent Application No. 10-2007-7029217.

* cited by examiner

*Primary Examiner* — Daborah Chacko Davis
(74) *Attorney, Agent, or Firm* — Nields, Lemack & Frame, LLC

(57) ABSTRACT

A method for fabricating a micromachine component of resin comprising step (a) of forming a sacrifice layer on a substrate, step (b) of forming at least two photosensitive resin composition layers sequentially on the sacrifice layer, and performing photolithography of each photosensitive resin composition layer to form an air gap portion defining the circumferential edge portion of the micromachine component and an air gap portion where an internal structure of the micromachine component is constituted to form a multilayer structure, step (c) for depositing dry film resist on the multilayer structure of the cured photosensitive resin composition layer, and performing photolithography of the dry film resist layer to form a cured dry film resist layer in which an air gap portion defining the circumferential edge of a shroud layer and an air gap where the structure of the shroud layer is constituted are formed, and step (d) for separating the micromachine component having the multilayer structure of the cured photosensitive resin composition layer and the cured dry film resist layer from the substrate by removing the sacrifice layer.

10 Claims, 2 Drawing Sheets

(1)

(2)

US 8,481,248 B2

METHOD FOR FABRICATING MICROMACHINE COMPONENT OF RESIN

TECHNICAL FIELD

The present invention relates to a method for fabricating a resin-made micromachine component. Particularly, the present invention relates to a simple, low-cost and high-precision method for fabricating a resin-made micromachine component having a shroud.

BACKGROUND ART

Devices obtained by integrating fine mechanical elements, electronic circuits, optical elements and the like are called microelectromechanical systems (MEMS) or micromachines; many applications thereof have been studied; and a part thereof is in practical use. These devices are generic names of devices which exhibit complicate and advanced functions while they are small-size components based on the semiconductor manufacturing technology, and are important components holding the key to microsystems such as various sensors, printer heads, disk heads, optical switches for communication and biochips. The technology in this field, being different from the manufacturing technology of semiconductors in which mainly planar microstructures are formed, necessitates the process of a high aspect ratio (a ratio of height/width of a structural body) since products requests a mechanical strength and a three-dimensional internal structure.

As manufacturing methods of structural bodies having a high aspect ratio, X-ray lithography of a photosensitive resin composition, called "LIGA process", (see Non-Patent Document 1), a pattern forming method by the deep reactive ion etching (Deep RIE) of a silicon substrate (see Non-Patent Document 2) and the like are already employed. Here, the LIGA process necessitates an expensive X-ray apparatus and has a drawback of requiring a long time for X-ray irradiation. With respect to this point, if the ultraviolet (UV) lithography system can be applied, advantages such as resources saving, energy saving, workability improvement and productivity improvement can be expected. However, whereas the UV lithography system has progressed in applications to the manufacturing technology of semiconductors by the above-mentioned formation of planar microstructures using a photosensitive resin as a photoresist, it has not progressed in applications to the manufacturing technology of micromachine components requiring a mechanical strength and a three-dimensional internal structure.

On the other hand, formation of a microfluidic channel by a multilayer structure of photosensitive resin composition layers processed by photolithography is reported. The obtained microfluidic channel is that fixed on a glass substrate (see Non-Patent Document 3).

As photosensitive resin compositions usable in UV lithography, photosensitive resin compositions composed of an epoxy resin and a photocationic polymerization initiator are disclosed in Patent Document 1 and Patent Document 2.

On the other hand, a technology to fabricate a microimpeller for MEMS by Deep RIE using silicon is reported by researchers of Massachusetts Institute of Technology (MIT). The microimpeller is used, for example, for a coin-sized gas turbine generator. A gas turbine generator is constituted mainly of a turbine, a compressor, a combustor and a generator, but if the compressor and the generator (motor) are combined, an ultrasmall air pump can be fabricated. The ultrasmall air pump can be used, for example, as an apparatus for supplying air to a small fuel cell. Since the above-mentioned silicon-made microimpeller is expensive though excellent in thermal resistance, and the field where the high thermal resistance as described above is not required does not require microimpellers made of silicon, fabrication of microimpellers made of less expensive materials is desired.

Patent Document 1: U.S. Pat. No. 4,882,245
Patent Document 2: U.S. Pat. No. 5,026,624
Non-Patent Document 1: "Kobunshi (Polymers)", vol. 43, p. 564(1994)
Non-Patent Document 2: Journal of the Surface Finishing Society of Japan, vol. 55, No. 3, p. 12(2004)
Non-Patent Document 3: Sensors and Actuators, B48(1998), p. 356

DISCLOSURE OF THE INVENTION

Problems to be Solved by the Invention

As described above, although the method of processing a silicon substrate by Deep RIE as a fabricating method of microimpellers for MEMS is known, the method has problems of a high cost and the silicon itself being easily broken. On the other hand, conventional methods by injection molding of plastics for fabricating resin-made microimpellers cannot achieve the preciseness required for microimpellers. Further, any of these methods is not optimum as a fabricating method of microimpellers having a three-dimensional internal structure, for example, a structure having a shroud (side plate) and a core. Therefore, establishing a method for simply and inexpensively fabricating high-precision microimpellers is desired.

Means for Solving the Problems

As a result of exhaustive studies to solve the above-mentioned problems, the present inventors have found that the above-mentioned problems can be solved by applying means of photolithography including the use of a dry film resist as a shroud layer, and have accomplished the present invention.

That is, the present invention is related to:
(1) A method for fabricating a resin-made micromachine component, characterized in that the method comprises the steps of:
  (a) forming a sacrifice layer on a substrate;
  (b) forming in layers at least two photosensitive resin composition layers sequentially on the sacrifice layer, and subjecting each of the formed photosensitive resin composition layers to photolithography corresponding to the internal structure of the intended micromachine component to form an air gap portion defining a circumferential edge portion of the micromachine component and an air gap portion constituting the internal structure of the micromachine component, thereby forming a multilayer structure of cured photosensitive resin composition layers;
  (c) laminating a dry film resist on the multilayer structure of the cured photosensitive resin composition layers, and subjecting the dry film resist layer to photolithography corresponding to the structure of a shroud layer to form a cured dry film resist layer in which an air gap portion defining a circumferential edge portion of the shroud layer and an air gap portion constituting the structure of the shroud layer are formed; and
  (d) separating the micromachine component having the multilayer structure of the cured photosensitive resin composition layers and the cured dry film resist layer and composed of the multilayer body in which the circumferential edge portions are defined, from the substrate by removing the sacrifice layer;

(2) The method for fabricating a resin-made micromachine component described in (1) above, wherein the photosensitive resin composition for the layers other than the shroud layer is a liquid photosensitive resin composition;

(3) The method for fabricating a resin-made micromachine component described in (1) above, wherein the photosensitive resin composition for the layers other than the shroud layer is a dry film resist;

(4) The method for fabricating a resin-made micromachine component described in any one of (1) to (3) above, wherein the photosensitive resin composition of the each layer is a photocurable resin composition;

(5) The method for fabricating a resin-made micromachine component described in (4) above, wherein a crosslinking ingredient of the photocurable resin composition is an epoxy resin, an amino compound, an acryl resin or a polyimide precursor;

(6) The method for fabricating a resin-made micromachine component described in (5) above, wherein the photosensitive resin composition of the each layer is a photosensitive resin composition comprising an epoxy resin and a photocationic polymerization initiator;

(7) The method for fabricating a resin-made micromachine component described in any one of (1) to (6) above, wherein the sacrifice layer is an alkali-soluble resin composition, and wherein the sacrifice layer is removed using an alkaline aqueous solution to separate the micromachine component from the substrate;

(8) The method for fabricating a resin-made micromachine component described in any one of (1) to (7) above, wherein a structural body is further formed on the cured dry film resist layer;

(9) The method for fabricating a resin-made micromachine component described in any one of (1) to (7) above, wherein the micromachine component is constituted of a multilayer structure of the two cured photosensitive resin composition layers and the one cured dry film resist layer;

(10) The method for fabricating a resin-made micromachine component described in any one of (1) to (9) above, wherein the micromachine component is a microimpeller;

(11) The method for fabricating a resin-made micromachine component described in any one of (1) to (10) above, wherein a micromachine component being a fixed component is formed outside an air gap portion defining the circumferential edge portion of a micromachine component being a movable component simultaneously with the formation of the micromachine component being the movable component, thereby forming a micromachine component having a core structure in which the micromachine component being the movable component is accommodated inside the micromachine component being the fixed component; and

(12) The method for fabricating a resin-made micromachine component described in (11) above, wherein the movable component is a microimpeller and the fixed component is a stator.

"Air gap portion" in the present invention refers not only to a portion interposed between two walls, so to speak, "spacing portion", but to "step portion" defined by one wall.

Effect of the Invention

According to the present invention, a method for fabricating a high-precision resin-made micromachine component, for example, a resin-made microimpeller, in a simple way and a low cost is provided.

BRIEF DESCRIPTION OF THE DRAWINGS

FIG. 1(2) is a schematic diagram showing a shroud-type microimpeller having a shroud.

DESCRIPTION OF SYMBOLS

Figure 1:
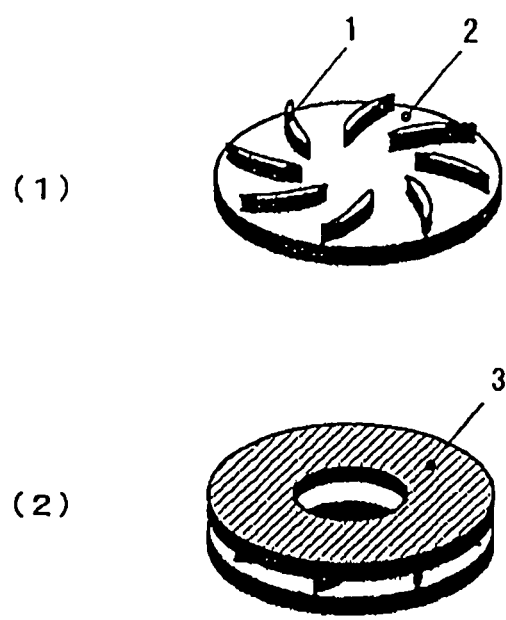
FIG. 1(1) is a schematic diagram showing an open-type microimpeller having no shroud.

In FIG. 1, reference numeral 1 denotes a blade; reference numeral 2 denotes a hub; and reference numeral 3 denotes a shroud.

Figure 2:
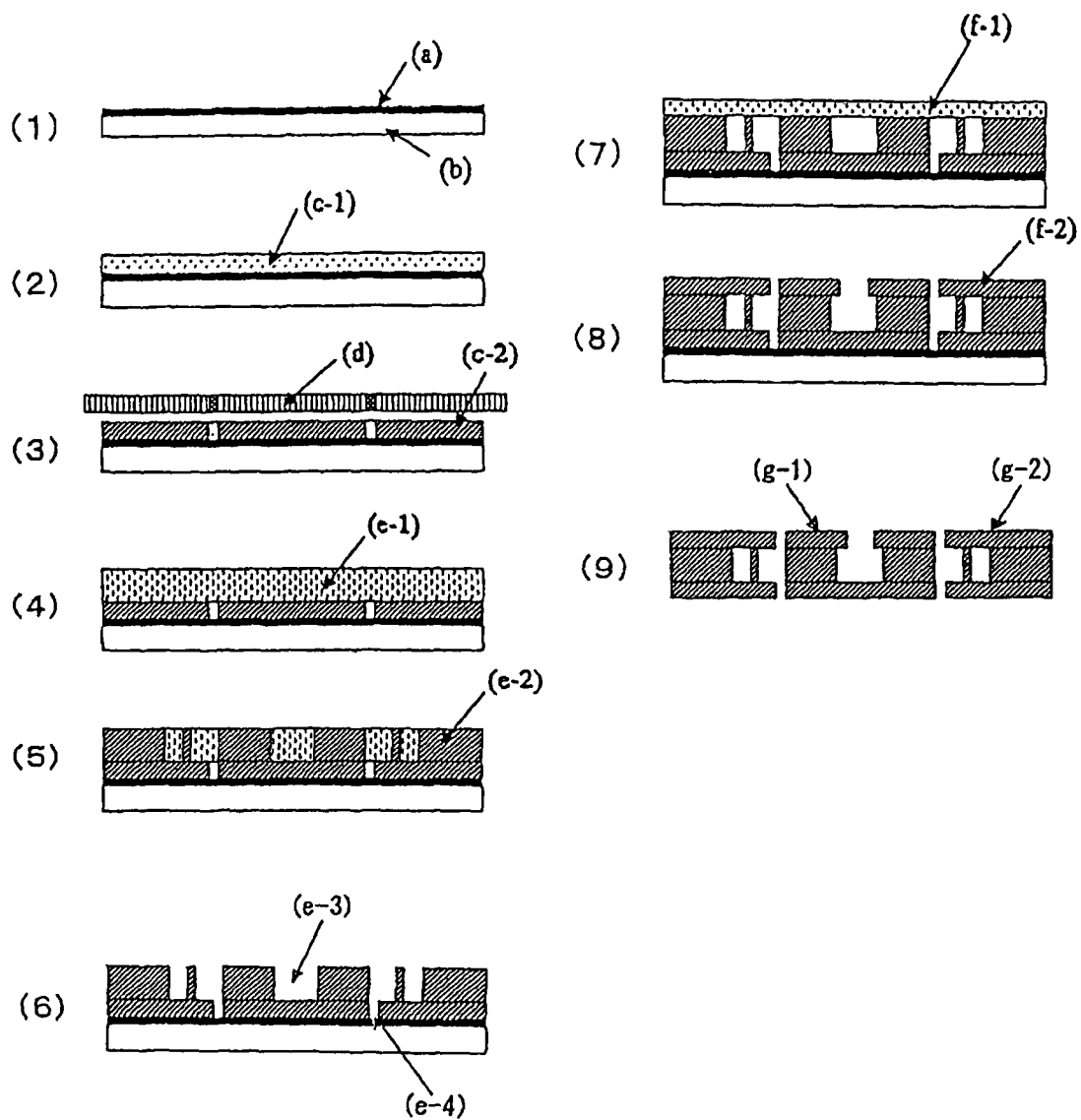
FIGS. 2(1) to (9) are schematic sectional diagrams showing fabricating steps of a resin-made microimpeller having a three-layer structure according to the method of the present invention.

In FIG. 2, reference numeral (a) denotes an alkali-soluble resin composition; (b), a substrate; (c), a photosensitive resin composition (first layer); (d), a photomask; (e-1) and (e-2), a photosensitive resin composition (second layer); (e-3) and (e-4), air gap portions; (f), a dry film resist (third layer); (g-1), a movable component; and (g-2), a fixed component.

BEST MODE FOR CARRYING OUT THE INVENTION

Hereinafter, the present invention will be in detail described.

A resin-made micromachine component fabricated by the fabricating method of the present invention has a three-dimensional internal structure and a shroud, and a layer-structure having three or more layers, and each layer is composed of a cured resin composition.

In the fabricating method of a resin-made micromachine component of the present invention, a resin composition used for the layers other than the shroud layer will first be described. As a resin composition used for the layers other than the shroud layer, a resin composition having a photosensitivity and capable of being pattern-formed through a development process is used. Its cured resin is preferably excellent in strength, chemicals resistance, thermal resistance and the like. Such a resin composition is preferably a photocurable resin composition, including UV adhesives and negative type resists. Such a composition is preferably a photosensitive resin composition containing an epoxy resin, amino compound, acryl resin, polyimide precursor or the like as a crosslinking ingredient, and a hardener or a polymerization initiator and the like necessary for the crosslinking ingredient and well-known as itself. The resin composition optionally contains other resin ingredients, plasticizers and the like. A resin composition used for each layer may be mutually the same or different.

The epoxy resins include bisphenol A epoxy resins, phenol novolac epoxy resins, cresol novolac epoxy resins, trisphenolmethane epoxy resins, alicyclic epoxy resins and the like. The amino compounds include melamine resins, urea resins, guanamine resins, glycoluryl-formaldehyde resins, succinylamide-formaldehyde resins, ethyleneurea-formaldehyde resins and the like, and especially alkoxymethylated amino resins and the like such as alkoxymethylated melamine resins and alkoxymethylated urea resins are suitably used. The acryl resins include acrylate ester resins and copolymers of an acrylate ester and a vinylphenol and the like. The polyimide precursors include ester-bonded photosensitive polyimide precursors obtained by ester-bonding a photosensitive group to a carboxyl group in a polyamic acid molecule and ion-bonded photosensitive polyimide precursors obtained by ion-bonding a photosensitive group to a carboxyl group or its salt group in a polyamic acid molecule.

Resin compositions containing these resins and hardeners or polymerization initiators necessary for these resins are prepared by well-known methods, but the form of these resin compositions are preferably a liquid composition diluted with a solvent or the like.

As a hardener or polymerization initiator of an epoxy resin, compounds generating an acid directly or indirectly by light and causing cationic polymerization (cationic polymerization initiator) are used and they are not especially limited, but include, for example, aromatic iodonium complex salts and aromatic sulfonium complex salts. The aromatic iidonium complex salts include, for example, diphenyliodonium tetrakis(pentafluorophenyl)borate, diphenyliodonium hexafluorophosphate, diphenyliodonium hexafluoroantimonate and di(4-nonylphenyl)iodonium hexafluorophosphate. The aromatic sulfonium complex salts include triarylsulfonium complex salts, for example, triphenylsulfonium hexafluorophosphate, triphenylsulfonium hexafluoroantimonate, triarylsulfonium hexafluoroantimonate, triphenylsulfonium tetrakis(pentafluorophenyl)borate, 4,4'-bis[diphenylsulfonio]diphenylsulfide-bishexafluorophosphate, 4,4'-bis[di(p-hydroxyethoxy)phenylsulfonio]diphenylsulfide-bishexafluoroantimonate, 4,4'-bis[di(i-hydroxyethoxy)phenylsulfonio]diphenylsulfide-bishexafluorophosphate, 7-[di(β-toluyl)sulfonio]-2-isopropylthioxanthone hexafluorophosphate, 7-[di(p-toluyl)sulfonio]-2-isopropylthioxanthone hexafluoroantimonate, 7-[di(p-toluyl)sulfonio]-2-isopropyltetrakis(pentafluorophenyl)borate, phenylcarbonyl-4'-diphenylsulfonio-diphenylsulfide-hexafluorophopate, phenylcarbonyl-4'-diphenylsulfonio-diphenylsulfide-hexafluoroantimonate, 4-ter-butylphenylcarbonyl-4'-diphenylsulfonio-diphenylsulfide-hexafluorophosphate, 4-ter-butylphenyl carbonyl-4'-diphenylsulfonio-diphenylsulfide-hexafluoroantimonate and 4-ter-butylphenylcarbonyl-4'-diphenylsulfonio-diphenylsulfide-tetrakis (pentafluorophenyl)borate.

Next, as a hardener or polymerization initiator of an amino compound, compounds generating an acid directly or indirectly by light, and are not especially limited, but specifically include: halogen-containing triazine compounds such as 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds such as tris(2,3-dibromopropyl)isocyanurate; bissulfonyldiazomethanes such as α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, bis(p-toluenesulfonyl)diazomethane, bis(1,1-dimethylethylsulfonyl)diazomethane, bis(cyclohexylsulfonyl)diazomethane and bis (2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sufonate esters such as pyrogallol trimesylate, pirogallol tritosylate, benzyl tosylate, benzyl sulfonate, N-methylsulfonyloxysuccinimide, N-trichloromethylsulfonyloxysuccinimide, N-phenylsulfonyloxymaleimide and N-methylsulfonyloxyphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzoin tosylates such as benzoin tosylate and α-methylbenzoin tosylate; and others such as diphenyl iodonium salts, triphenyl sulfonium salts, phenyldiazonium salts and benzyl carbonate. Especially, triazine compounds are preferably used since they have a high performance as an acid generating agent by light and a favorable solubility in the case of using a solvent. Among them, bromo-containing triazine compounds, especially 2,4-bis(trichloromethyl)-6-(3-bromo-4-methoxy)phenyl-s-triazine, 2,4-bis(trichloromethyl)-6-(3-bromo-4-methoxy)styryl-s-triazine and tris(2,3-dibromopropyl)isocyanurate, are suitably used.

Further, as a hardener or polymerization initiator of an acryl resin and a photosensitive polyimide precursor, photoradical polymerization initiators capable of reacting ethylenic compounds are used, and are not especially limited, but include, for example, α-diketones such as benzil and diacetyl; acyloins such as benzoin; acyloin ethers such as benzoin methyl ether, benzoin ethyl ether and benzoin isopropyl ether; benzophenones such as thioxanthone, 2,4-diethylthioxanthone, thioxanthone-4-sulfonic acid, benzophenone, 4,4'-bis (dimethylamino)benzophenone and 4,4'-bis (diethylamino) benzophenone; acetophenones such as acetophenone, p-dimethylaminoacetophenone, α,α'-dimethoxyacetoxybenzophenone, 2,2'-dimethoxy-2-phenylacetophenone, p-methoxyacetophenone, 2-methyl[4-(methylthio)phenyl]-2-morpholino-propanone and 2-benzyl-2-dimethylamino-1-(4-morpholinophenyl)-butane-1-one; quinones such as anthraquinone and 1,4-naphthoquinone; halogen compounds such as phenacyl chloride, tribromomethyl phenyl sulfone and tris(trichloromethyl)-s-triazine; peroxides such as di-t-butyl peroxide; and acylphosphine oxides such as 2,4,6-trimethylbenzoyldiphenylphosphine oxide. Favorable compounds among the above-mentioned photopolymerization initiators are exemplified as acetophenones such as 2-methyl-[4-(methylthio)phenyl]-2-morpholino-1-propane and 2-benzyl-2-dimethylamino-1-(4-morpholinophenyl)-butane-1-one, and halogen compounds such as phenacyl chloride, tribromomethyl phenyl sulfone, 2,4,6-trimetylbenzoyldiphenylphosphine oxide and tris(trichloromethyl)-s-triazine.

In the present invention, among the above-mentioned photosensitive resin compositions, a photosensitive resin composition containing an epoxy resin and a photocationic polymerization initiator is especially preferable, and a resin composition obtained by dissolving the photosensitive resin composition in an organic solvent having a boiling point of 40 to 150° C. (for example, cyclopentanone, γ-butyrolactone and propylene glycol monomethyl ether acetate) and making it into a liquid is preferable as a resin composition for preparing layers other than the shroud layer. Herein, as the epoxy resin, any epoxy resin can be used as long as the epoxy resin has sufficient epoxy groups to form patterns in one molecule. Such an epoxy resin includes bisphenol A epoxy resins, phenol novolac epoxy resins, cresol novolac epoxy resins and trisphenolmethane epoxy resins. Among them bisphenol A epoxy resins are preferable. The bisphenol A epoxy resins are commercially easily available as Epikote 157S70 (Japan Epoxy Resins Co., Ltd.) and the like.

As the photocationic polymerization initiator, compounds generating a protonic acid by irradiation of active rays such as ultraviolet rays are preferable, and include, for example, aromatic iodonium complex salts and aromatic sulfonium complex salts, especially preferably aromatic sulfonium complex salts. The aromatic sulfonium complex salts preferably include [4-{4-(2-chlorobenzoyl) phenylthio}phenylbis(4-fluorophenyl)sulfonium hexafluoroantimonate, triarylsulfonium hexafluoroantimonate and the like, and are commercially easily available respectively as SP-172 (Asahi Denka Co., Ltd.), UVI-6974 (Dow Chemical Co.) and the like. Epoxy resin compositions containing such an epoxy resin and such a photocationic polymerization initiator are commercially easily available, for example, as SU-8 3050N-02 (trade name, an epoxy-based negative resist, KAYAKU MICROCHEM CORPORATION).

As described above, a resin composition used for layers other than the shroud layer is preferably generally a liquid photosensitive resin composition diluted with a solvent or the like, but may be a dry film resist described later, which is a solid photosensitive resin composition.

Next, a dry film resist, which is a solid photosensitive resin composition, used in the fabricating method of a resin-made micromachine component of the present invention will be described. As a dry film resist used for forming a shroud layer in the present invention, any dry film resist can be used as long as it can easily be laminated into a structural body which has asperities, has a thickness of at least approximately 10 μm, and can be subjected to photolithography. Such a dry film resist is obtained by dissolving in a solvent (for example, methyl ethyl ketone) a resin composition containing an above-mentioned epoxy resin, amino compound, acryl resin, polyimide precursor or the like, and a hardener, polymerization initiator or the like necessary therefor, applying the solution on a support such as polyethylene terephthalate film, polyester film or polyethylene film, and drying the coated film. The resin is preferably an epoxy resin composition containing an epoxy resin and a photocationic polymerization initiator like the above-mentioned resin used for layers other than the shroud. The support is preferably a polyethylene terephthalate film. Such a dry film resist can be converted to a dry film by optionally diluting the above-mentioned resin composition with a solvent, thereafter applying the composition on a support by a roll coater, doctor bar, wire bar system, dipping system, spin coat system, gravure system, doctor blade system or the like, then drying the composition in a drying furnace whose temperature is set at approximately 50 to approximately 150° C. to remove a predetermined amount of the solvent, and optionally pasting a release film on the composition. In the present invention, when the dry film is used, an arbitrary film thickness can be formed by superposing the dry films.

In the above, as a developing agent to develop each photosensitive resin composition layer, propylene glycol monomethyl ether acetate, γ-butyrolactone and the like are used, and the development is performed under conditions such as 15 to 40° C. and 2 to 50 min using these developing agents.

Micromachine components which the method of the present invention targets have a shroud (side plate) and a three-dimensional internal structure, and include, for example, a microimpeller and a microgear. FIG. 1 is a schematic diagram showing prototypes of a microimpeller. FIG. 1(1) shows an open-type microimpeller having no shroud; in the figure, reference numeral 1 denotes a blade and reference numeral 2 denotes a hub. FIG. 1(2) shows a shroud-type microimpeller having a shroud; in the figure, reference numeral 3 denotes a shroud. A microimpeller which the method of the present invention targets is the latter type microimpeller.

The fabricating method of the resin-made micromachine component of the present invention essentially comprises the four steps of:

(a) forming a sacrifice layer on a substrate;

(b) forming a multilayer structure of at least two cured photosensitive resin composition layers in which a circumferential edge portion and an air gap portion corresponding to an internal structure of the micromachine component are formed by utilizing photolithography;

(c) forming a cured dry film resist layer in which a circumferential edge portion and an air gap portion corresponding to a structure of a shroud layer are formed by utilizing photolithography; and (d) separating the micromachine component from the substrate by removing the sacrifice layer.

Hereinafter, the fabricating method of the resin-made micromachine component of the present invention will be described taking a resin-made microimpeller as an example.

First, a substrate used in the fabricating method of the resin-made microimpeller according to the present invention will be described. The substrate is not especially limited as long as it has a strength on a level of causing no deformation of the substrate when it is subjected to photolithography. Preferable ones include silicon wafer, glass substrate, plastic substrate, ceramic substrate, metal plate and plastic film which have a thickness of 300 to 1,000 μm. Such a substrate can be commercially easily available.

In the present invention, for the purpose of separating a resin-made microimpeller from a substrate, a sacrifice layer is provided between the substrate and the microimpeller. Herein, "sacrifice layer" means a layer formed of a material which can be dissolved and removed by a medium which dissolve neither of the substrate nor the micromachine component.

A material for a sacrifice layer may be either an inorganic material or an organic material as long as the sacrifice layer can be dissolved without corroding a microimpeller, and is not especially limited, but is preferably particularly an alkali-soluble resin composition in view of safety and versatility. Such an alkali-soluble resin composition is preferably a resin composition which easily dissolves in an alkaline aqueous solution, preferably in an approximately 0.5 to 5-wt. % aqueous solution of tetramethylammonium hydroxide. Examples of such an alkali-soluble resin composition include alkali-soluble polyimides, alkali-soluble acryl resins and alkali-soluble epoxy resins, and alkali-soluble polyimides excellent in the organic solvent resistance are especially preferable. Such alkali-soluble polyimide resin compositions are commercially available, for example, as PMGI SFG19 (trade name, an imide resin composition, KAYAKU MICROCHEM CORPORATION).

Hereinafter, the fabricating method of the present invention will be described referring to FIG. 2 showing schematic sectional diagrams of each step in the fabricating method of the present invention and taking as an example a fabricating method of a resin-made microimpeller having a multilayer structure of three layers.

An alkali-soluble resin composition (a) is spin-coated on a substrate (b) in a condition of the film thickness of 1 to 50 μm, and thereafter, the composition is heated on a hot plate or in an oven of 120 to 250° C. for approximately 1 to 30 min to form an alkali-soluble sacrifice layer (FIG. 2(1)). Then, after the sacrifice layer is air-cooled to room temperature, a photosensitive resin composition is spin-coated or cast in a condition of the film thickness of 50 to 1,000 μm as a first layer (c-1) on the sacrifice layer, and then, heated on a hot plate or in an oven of 40 to 120° C. for approximately 2 to 60 min to form a first photosensitive resin composition layer (FIG. 2(2)). Then, the first photosensitive resin composition layer is exposed through a predetermined photomask (d) in a condition of the exposure amount at from 350 to 420 nm of 100 to 5,000 mJ/cm$^2$ by an UV aligner, and heated on a hot plate of 50 to 140° C. for approximately 3 to 20 min to form a first cured photosensitive resin composition layer (cured film) (c-2) (FIG. 2(3)). A photosensitive resin composition is spin-coated or cast in a condition of the film thickness of 50 μm to 5 mm as a second photosensitive resin composition layer (e-1) on the first layer thus obtained, and then, heated on a hot plate or in an oven of 40 to 120° C. for approximately 2 to 60 min (FIG. 2(4)). Then, the second photosensitive resin composition layer is exposed through a predetermined photomask in a condition of the exposure amount at 365 nm of 100 to 10,000 mJ/cm$^2$ by an UV aligner, and heated on a hot plate of 50 to 140° C. for approximately 3 to 20 min for curing to form a second cured photosensitive resin composition layer (cured film) (e-2) (FIG. 2(5)). Herein, when the first layer and the second layer are formed, a method may be employed in which each layer having a desired thickness is provided by repeating the coating and heating till a target film thickness is obtained in the each layer.

After the formation of each of the first and second cured films is completed, the cured film is developed with a developing liquid to dissolve unexposed portions, for example, propylene glycol monomethyl ether acetate, γ-butyrolactone, cyclopentanone and acetone, preferably propylene glycol monomethyl ether acetate, at 15 to 50° C. for 5 to 60 min to obtain each of the first and second cured films in which a desired air gap portion is formed. After the development, the cured films are preferably subjected to rinsing and drying processes with isopropanol (IPA), ethanol or the like. Reference numerals (e-3) and (e-4) denote an air gap portion inside the second layer of a microimpeller (movable component) and an air gap portion defining the circumferential edge portion of the microimpeller, respectively (FIG. 2(6)). Then, a third layer is formed as a shroud by adhering a dry film resist (f-1) on the upper surface of the second layer, and heating and laminating them at 40 to 80° C. in a condition of a pressure of 0.01 to 1.0 kg/cm$^2$ (FIG. 2(7)). The third layer is exposed through a predetermined photomask in a condition of the exposure amount at from 350 to 420 nm of 100 to 5,000 mJ/cm$^2$ by an UV aligner, and heated on a hot plate of 50 to 140° C. for approximately 1 to 30 min to obtain a cured third layer whose exposed portions have been cured. Then, the shroud is obtained, as the cured third layer (f-2) in which a desired air gap portion is formed, by developing the unexposed portions with the above-mentioned developing liquid at 15 to 50° C. for 5 to 20 min (FIG. 2(8)). The cured third layer is preferably subjected to rinsing and drying processes as described above. The layers may be hard-baked at 90 to 200° C. for 1 to 60 min after the drying process after each development for the purpose of the curing promotion and the complete removal of the developing liquids. Then, the substrate is separated from the microimpeller by dissolving the sacrifice layer by immersing the sacrifice layer in the above-mentioned alkaline aqueous solution, for example, at 0 to 100° C. for 1 to 24 h, and the microimpeller is washed with pure water and dried to obtain a resin-made microimpeller. In each step described above, simultaneously with the formation of the microimpeller being a movable component, a stator being a fixed component is as a result formed outside the air gap portion defining the circumferential edge portion of the microimpeller to effect the formation of a micromachine component having a core structure in which the microimpeller being a movable component is accommodated inside the stator being a fixed component. In the figure, reference numerals (g-1) and (g-2) denote a microimpeller and a stator, respectively (FIG. 2(9)).

Heretofore, a fabricating method of a resin-made microimpeller having a multilayer structure of three layers has been described, but a resin-made microimpeller having a multilayer structure of four or more layers can also be fabricated according to the above described by adding layers between the first layer and the shroud layer. However, the fabricating method of the present invention is most preferably applied to fabrication of a resin-made microimpeller having a three-layer structure composed of the multilayer structure of two cured photosensitive resin composition layers and one cured dry film resist layer. If required, some structure can be further formed on the shroud layer. In this case, use of a dry film resist is preferable.

The fabricating method of a resin-made microimpeller of the present invention has simple steps. Accordingly, the method has excellent features of a low cost, and a high precision of the obtained resin-made microimpeller.

EXAMPLES

Hereinafter, the present invention will be further specifically described by way of examples.

Reference Example 1

An epoxy-based negative resist (trade name: SU-8 3050N-02, KAYAKU MICROCHEM CORPORATION) was uniformly applied on a polyethylene terephthalate film, and dried at 65° C. for 10 min and at 90° C. for 30 min in a warm air convective drier to obtain a dry film resist having a resin composition layer of 30 μm in thickness.

Example 1

An imide resin composition (trade name: PMGI SFG19, KAYAKU MICROCHEM CORPORATION) was spin-coated on a silicon substrate of 525 μm in thickness and 4" in diameter at 3,000 rpm for 30 sec, and thereafter, heated on a hot plate of 170° C. for 10 min to form an alkali-soluble sacrifice layer.

The sacrifice layer was air-cooled to room temperature; thereafter, an epoxy-based negative resist (trade name: SU-8 3050N-02, KAYAKU MICROCHEM CORPORATION) was spin-coated on the sacrifice layer at 1,000 rpm for 20 sec, and then heated on a hot plate of 95° C. for 30 min; and the resist was further spin-coated on the above spin-coated layer at 1,000 rpm for 20 sec (i.e. "two-times coating"), and then heated on a hot plate of 95° C. for 4 hours to make a first layer. The first layer was subjected to exposure of 400 mJ/cm$^2$ in which a circumferential edge portion of a microimpeller was set as an unexposed portion, using a mask aligner (trade name: MA6, SUSS MicroTec) using an ultrahigh pressure mercury lamp as a light source and through a photomask. Then, the exposed layer was heated on a hot plate of 65° C. for 15 min, and a second layer was applied as follows. An operation was four times repeated in which the above SU-8 3050N-02 was spin-coated on the first layer at 1,000 rpm for 20 sec, and heated on a hot plate of 95° C. for 30 min. Thereafter, the spin-coated layers were heated on a hot plate of 95° C. for 9.5 hours. The second layer thus obtained was subjected to exposure of 1,000 mJ/cm$^2$ in which an air gap portion and a circumferential edge portion of the second layer of the microimpeller were set as unexposed portions, using the mask aligner and through a photomask, thereafter, heated at 65° C. for 15 min, then immersed in propylene glycol monomethyl ether acetate at 23° C. for 30 min for development (removal of the unexposed portions), and thereafter, rinsed with IPA and dried.

Then, a shroud layer (third layer) was laminated on the second layer by laminating six times the dry film resist fabricated in Reference Example 1 on the upper surface of the second layer with the resin composition layer of the dry film resist directed downward, and heating the pile of dry film resist at 45° C. in a condition of a pressure of 0.2 kg/cm$^2$. The third layer was subjected to exposure of 400 mJ/cm$^2$ in which a circumferential edge portion of the microimpeller (shroud) was set as unexposed portions, using the mask aligner using the ultrahigh pressure mercury lamp and through a photomask, thereafter, heated at 95° C. for 15 min, then immersed in propylene glycol monomethyl ether acetate at 23° C. for 15 min for development, and then rinsed with IPA and dried to obtain a multilayer structural body having an internal structure composed of the first and second layers and the shroud (third layer) through the sacrifice layer on the silicon substrate. In this multilayer structural body, a core structure was as a result formed in which the microimpeller being a movable component was incorporated as a core inside a stator being a fixed component. Then, the multilayer structural body was immersed in a 2.38-wt. % tetramethylammonium hydroxide aqueous solution at 23° C. for 12 hours to dissolve the sacrifice layer to separate and remove the silicon substrate, and thereafter, the target multilayer structural body was washed with pure water, and dried to obtain a resin-made microimpeller.

Example 2

An imide resin composition (trade name: PMGI SFG19, KAYAKU MICROCHEM CORPORATION) was spin-coated on a silicon substrate of 525 μm in thickness and 4" in diameter at 3,000 rpm for 30 sec, and thereafter, heated on a hot plate of 170° C. for 10 min to form an alkali-soluble sacrifice layer.

The sacrifice layer was air-cooled to room temperature; thereafter, an epoxy-based negative resist (trade name: SU-8 3050N-02, KAYAKU MICROCHEM CORPORATION) was spin-coated on the sacrifice layer at 1,000 rpm for 20 sec, and then heated on a hot plate of 95° C. for 40 min (i.e. "one-time coating") to make a first layer. The first layer was subjected to exposure of 400 mJ/cm$^2$ in which a circumferential edge portion of a microimpeller was set as an unexposed portion, using a mask aligner (trade name: MA6, SUSS MicroTec) using an ultrahigh pressure mercury lamp as a light source and through a photomask. Then, the exposed layer was heated on a hot plate of 65° C. for 15 min, and a second layer was applied as follows. An operation was two times repeated in which the above SU-8 3050N-02 was spin-coated on the first layer at 1,000 rpm for 20 sec, and heated on a hot plate of 95° C. for 30 min; and the coated layer was further heated at 95° C. for 3 hours. The second layer thus obtained was subjected to exposure of 800 mJ/cm$^2$ in which an air gap portion and a circumferential edge portion of the second layer of the microimpeller were set as unexposed portions, using the mask aligner and through a photomask, thereafter, heated at 65° C. for 15 min, then immersed in propylene glycol monomethyl ether acetate at 23° C. for 30 min for development, and thereafter, rinsed with IPA and dried.

Then, a shroud layer (third layer) was laminated on the second layer by laminating three times the dry film resist fabricated in Reference Example 1 on the upper surface of the second layer with the resin composition layer of the dry film resist directed downward, and heating the pile of dry film resist at 45° C. in a condition of a pressure of 0.2 kg/cm$^2$. The third layer was subjected to exposure of 400 mJ/cm$^2$ in which a circumferential edge portion of the microimpeller (shroud) was set as an unexposed portion, using the mask aligner using the ultrahigh pressure mercury lamp as a light source and through a photomask, thereafter, heated at 95° C. for 15 min, then immersed in propylene glycol monomethyl ether acetate at 23° C. for 15 min for development, and then rinsed with IPA and dried to obtain a multilayer structural body having an internal structure composed of the first and second layers and the shroud (third layer) through the sacrifice layer on the silicon substrate. In this multilayer structural body, a core structure was as a result formed in which the microimpeller being a movable component was incorporated as a core inside a stator being a fixed component. Then, the multilayer structural body was immersed in a 2.38-wt. % tetramethylammonium hydroxide aqueous solution at 23° C. for 12 hours to dissolve the sacrifice layer to separate and remove the silicon substrate, and thereafter, the target multilayer structural body was washed with pure water, and dried to obtain a resin-made microimpeller.

Example 3

After a multilayer structural body (a core structure in which a microimpeller is incorporated inside a stator) having an internal structure composed of the first and second layers and the shroud (third layer) through the sacrifice layer on the silicon substrate, is obtained as in Example 2, a fourth layer was further laminated on the shroud layer by adhering two sheets of the dry film resist fabricated in Reference Example 1 on the upper surface of the third layer with the resin composition layer of the dry film resist directed downward, and heating the fourth layer at 45° C. in a condition of a pressure of 0.2 kg/cm$^2$. The fourth layer thus obtained was subjected to exposure of 400 mJ/cm$^2$ using a mask aligner using an ultrahigh pressure mercury lamp as a light source and through a photomask, thereafter, heated at 95° C. for 15 min, then immersed in propylene glycol monomethyl ether acetate at 23° C. for 15 min for development, and then rinsed with IPA and dried to obtain a multilayer structural body having an internal structure composed of the first and second layers, the shroud (third layer) and the structural body (fourth layer) through the sacrifice layer on the silicon substrate. Then, the multilayer structural body was immersed in a 2.38-wt. % tetramethylammonium hydroxide aqueous solution at 23° C. for 12 hours to dissolve the sacrifice layer to separate and remove the silicon substrate, and thereafter, the target multilayer structural body was washed with pure water, and dried to obtain a resin-made microimpeller.

INDUSTRIAL APPLICABILITY

According to the method of the present invention, resin-made micromachine components such as high-precision resin-made microimpellers can be fabricated simply and in a low cost, and these are useful, for example, for ultrasmall air pumps usable as an apparatus to supply air to small-sized fuel cells and the like.

The invention claimed is:

1. A method for fabricating a resin-made micromachine component having an internal structure and a circumferential edge portion having a shape, and having a shroud having a shape, characterized in that the method comprises the steps of:
  (a) forming a sacrifice layer on a substrate, said sacrifice layer being made of a material which can be dissolved and removed by a medium which dissolves neither of said substrate nor the micromachine component on said substrate;
  (b) forming in layers negative photosensitive resin composition layers on said sacrifice layer, and subjecting each of said formed photosensitive resin composition layers to exposure with ultraviolet light using a first photomask corresponding to said internal structure and said shape of said circumferential edge portion, repeating said step of forming in layers negative photosensitive resin composition layers and said step of subjecting each of said formed photosensitive resin composition layers to exposure with ultraviolet light at least two times, and removing unexposed portions from the formed photosensitive resin composition layers comprising at least two layers of cured exposed portions, thereby forming a multilayer structure of the cured photosensitive resin composition layers;
  (c) laminating a first dry film resist made of a negative photosensitive resin composition on said multilayer structure of the cured photosensitive resin composition layers, and exposing with ultraviolet radiation said first dry film resist layer using a second photomask corresponding to said shape of said shroud, and removing unexposed portions of said first dry film resist to form a cured layer of said first dry film resist layer; and
  (d) separating said micromachine component having said multilayer structure of said cured photosensitive resin composition layers and said cured first dry film resist layer from said substrate by removing said sacrifice layer.

2. The method for fabricating a resin-made micromachine component according to claim 1, wherein each negative photosensitive resin composition layer formed in layers on said sacrifice layer in step (b) is formed from a photosensitive resin composition that is a liquid.

3. The method for fabricating a resin-made micromachine component according to claim 1, wherein each negative photosensitive resin composition layer formed in layers on said sacrifice layer in step (b) is formed from a photosensitive resin composition that is a second dry film resist.

4. The method for fabricating a resin-made micromachine component according to any one of claims 1 to 3, wherein a crosslinking ingredient of the photosensitive resin composition for said negative photosensitive resin composition layer formed in layers on said sacrifice layer in step (b) or for the first dry film resist layer laminated on the multilayer structure of the cured photosensitive resin composition layers is an epoxy resin, an amino compound, an acryl resin or a polyimide precursor.

5. The method for fabricating a resin-made micromachine component according to claim 4, wherein said photosensitive resin composition for the negative photosensitive resin composition layer formed in layers on said sacrifice layer in step (b) or for the first dry film resist layer laminated on the multilayer structure of the cured photosensitive resin composition layers comprises an epoxy resin and a photocationic polymerization initiator.

6. The method for fabricating a resin-made micromachine component according to any one of claims 1 to 3, wherein the sacrifice layer is an alkali-soluble resin composition, and wherein the sacrifice layer is removed using an alkaline aqueous solution to separate the micromachine component from the substrate.

7. The method for fabricating a resin-made micromachine component according to any one of claims 1 to 3, wherein a structural body is further formed on the cured first dry film resist layer laminated on said multilayer structure of the cured photosensitive resin composition layers.

8. The method for fabricating a resin-made micromachine component according to any one of claims 1 to 3, wherein the micromachine component is constituted of said multilayer structure of the two cured photosensitive resin composition layers formed in layers on said sacrifice layer in step (b) and the one cured first dry film resist layer laminated on said multilayer structure of the cured photosensitive resin composition layers.

9. The method for fabricating a resin-made micromachine component according to any one of claims 1 to 3, comprising a movable micromachine component and a fixed micromachine component, wherein said fixed micromachine component has said circumferential edge portion and said shroud and is formed outside said moveable micromachine component simultaneously with the formation of said moveable micromachine component having said internal structure and a moveable micromachine component shroud, thereby forming said micromachine component having a core structure in which said moveable micromachine component is accommodated inside said fixed micromachine component.

10. The method for fabricating a resin-made micromachine component according to claim 9, wherein said movable micromachine component is a microimpeller and said fixed micromachine component is a stator.

* * * * *